United States Patent [19]

Kamiya

[11] 4,329,657
[45] May 11, 1982

[54] AMPLIFIER WITH POWER SUPPLY SWITCHING

[75] Inventor: Shingo Kamiya, Hamamatsu, Japan
[73] Assignee: Nippon Gakki Seizo Kabushiki Kaisha, Hamamatsu, Japan
[21] Appl. No.: 196,871
[22] Filed: Oct. 14, 1980
[30] Foreign Application Priority Data Oct. 16, 1979 [JP] Japan ................... 54-133387

[51] Int. Cl.³ .................................. H03F 3/30
[52] U.S. Cl. .................................. 330/297; 330/267
[58] Field of Search ............... 330/202, 267, 268, 297

[56] References Cited
U.S. PATENT DOCUMENTS 3,772,606 11/1973 Waehner ....................... 330/267
4,218,660 8/1980 Carver ......................... 330/297

Primary Examiner—James B. Mullins
Assistant Examiner—Gene Wan
Attorney, Agent, or Firm—Spensley, Horn, Jubas & Lubitz

[57] ABSTRACT

An amplifier with power supply switching is arranged so that the levels of the power supply voltages to be supplied to the amplifying elements of the output stage are switched over in accordance with the level and the rise time of a signal corresponding to an input signal of the amplifier, thereby, to enhance the power efficiency and to prevent an increase of distortion, as well as to reduce switching noises which tend to occur during the switching of the power supply voltages.

15 Claims, 11 Drawing Figures

AMPLIFIER WITH POWER SUPPLY SWITCHING

BACKGROUND OF THE INVENTION (a) Field of the Invention:

The present invention relates to an amplifier with power supply switching, and more particularly to an amplifier of the type described which is arranged to effect switching of the levels of the power supply voltages to be supplied to the amplifying elements of the output stage in accordance with the level of a signal corresponding to an input signal.

(b) Description of the Prior Art:

There is known a power amplifier intended to improve the power efficiency thereof, arranged so that in case the level of an input signal is low, a power supply having a low level of voltage is connected to the output stage of the amplifier, and that in case the level of an input signal is high, the output stage is connected to a power supply having a high level of voltage. For example, FIG. 1 shows an example of such known power amplifier utilizing a single ended push-pull (SEPP) circuit of the balanced power supply type. In the Figure, reference numerals 1 and 2 represent transistors of the output stage which are arranged so that one 1 of the transistors is adapted to be connected to either a dc power supply 4 or to power supplies 3 and 4, whereas the other transistor 2 is adapted to be connected to either a dc power supply 5 or power supplies 5 and 6. In this example, in case the level of an input signal which is applied to an input terminal 7 is low, the transistors 1 and 2 are connected to the dc power supplies 4 and 5, respectively, whereas in case the level of an input signal is high, switching circuits 8 and 9 are both rendered to the conductive state, so that the transistors 1 and 2 are connected to the dc power supplies 3 and 4, and the dc supplies 5 and 6, respectively. The switching circuits 8 and 9 are adapted to be driven by a comparator circuit 11 which is to receive an output of an absolute value circuit 10. More specifically, the absolute value circuit 10 is a circuit intended to seek the absolute value of an output signal derived at an output terminal 13. The level of an output of this absolute value circuit 10 is compared with the level of a reference voltage $V_a$ in the comparator circuit 11, so that the on-off actions of the switching circuits 8 and 9 are controlled by the result of the comparison. This known power amplifier is so arranged that the level of an output signal is detected in place of direct detection of the level of an input signal. Also, a resistor 14 in the cirucitry is a load resistor.

In the known power amplifier having the foregoing circuit arrangement, the timing of switching of the switching circuits 8 and 9 provides problems. More particularly, if the level of the reference voltage $V_a$ is set substantially equal to the level of the voltage of either the dc power supply 4 or 5, there will occur such inconvenience that, when the input terminal 7 is applied with a high level input signal having a quick build-up, the timing of power supply from either the dc power supply 3 or 6 fails to follow the quick variations of the level of the input signal due to the delay of operation of the switching circuits 8 and 9, so that the resulting output signal will become distorted. Also, if the level of the reference voltage $V_a$ is set low to prevent the development of such distortion, there could occur an instance wherein, even when the input signal is of such level that can be covered sufficiently by the dc power supplies 4 and 5, the transistors 1 and 2 are supplied with voltages of a level representing the voltages of these dc power supplies 4 and 5 added with the voltage of the dc power supplies 3 and 6, respectively. For this reason, there arises the problem of an increased power loss and a lowered power efficiency in the transistors 1 and 2.

SUMMARY OF THE INVENTION

It is, therefore, a primary object of the present invention to provide an amplifier which is able to attain, at the same time, both the prevention of development of signal distortion and an enhanced power efficiency.

Another object of the present invention is to provide an amplifier of the type described, wherein the control of switching circuit is performed based on the level and the build-up time or speed of a signal corresponding to an input signal.

Still another object of the present invention is to provide an amplifier of the type described, which develops reduced switching noises during the switching of power supply voltages by the switching circuits.

DETAILED DESCRIPTION OF THE PREFERRED EMBODIMENTS

The present invention will hereunder be described of some preferred embodiments of the present invention by referring to the accompanying drawings.

Figure 1:
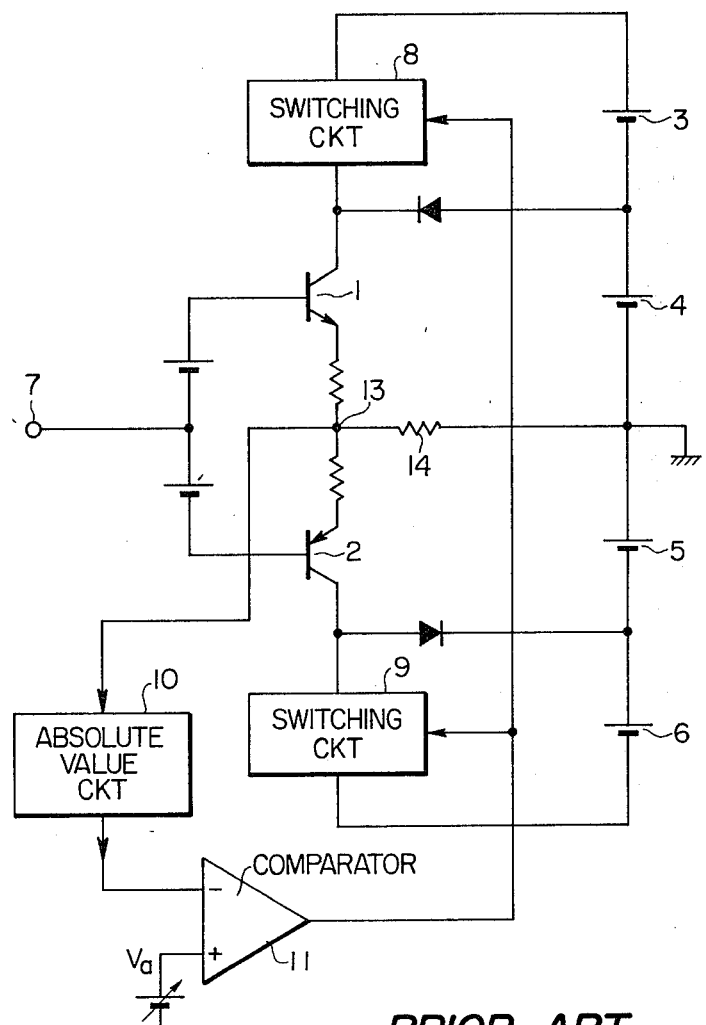
FIG. 1 is a block diagram showing a known power amplifier with means for switching power supply voltages.
Figure 2:
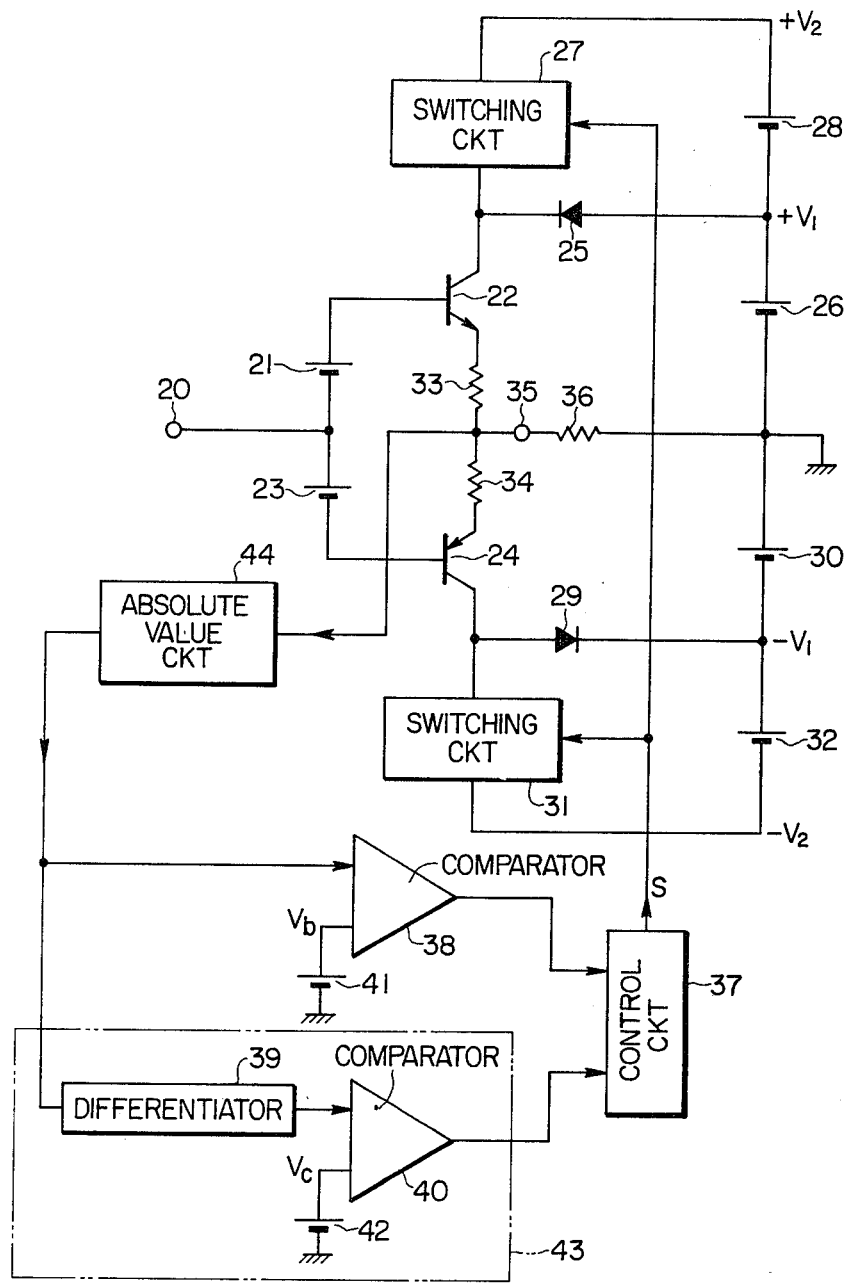
FIG. 2 is a block diagram showing the basic structure of power amplifier according to the present invention.

FIG. 2 is a block diagram showing the basic structure of the power amplifier according to the present invention. In the Figure, an input terminal 20 is connected to a base of a transistor 22 via a dc power supply 21, and also to the base of a transistor 24 via a dc power supply 23. In this embodiment, the dc power supplies 21 and 23 are intended for biasing the transistors 22 and 24, respectively. The collector of the transistor 22 is connected to a positive voltage terminal of a dc power supply 26 via a reverse-current preventing diode 25, and also to a positive voltage terminal of a dc power supply 28 via a switching circuit 27. Also, a negative voltage terminal of said dc power supply 28 is connected to the positive voltage terminal of the dc power supply 26. The collector of the transistor 24 is connected to a negative voltage terminal of a dc power supply 30 via a reverse-current preventing diode 29, and also to a negative voltage terminal of a dc power supply 32 via a switching circuit 31. Also, the positive voltage terminal of the dc power supply 32 is connected to the negative voltage terminal of the dc power supply 30. The emitters of the transistors 22 and 24 are connected to an output terminal 35 via resistors 33 and 34, respectively. The negative voltage terminal of the dc power supply 26 and the positive voltage terminal of the dc power supply 30 are both grounded. Also, a load resistor 36 is inserted between the output terminal 35 and the ground.

The diodes 25 and 29 are assigned to supply to the collectors of the transistors 22 and 24 a positive voltage $+V_1$ of the dc power supply 26 and a negative voltage $-V_1$ of the dc power supply 30, in case the switching circuits 27 and 31 are in their "off" state. Also, the switching circuits 27 and 31 are arranged to be controlled of their on-off actions by an output of a controlling circuit 37. In case these two switching circuits 27 and 31 are both in their "on" state, there is supplied to the collector of the transistor 22 a voltage $+V_2$ which is the sum of the respective output voltages of the dc power supplies 26 and 28, and also there is supplied to the collector of the transistor 24 a voltage $-V_2$ which is the sum of the respective output voltages of the dc power supplies 30 and 32.

Along therewith, an output signal derived at the output terminal 35 is supplied to one of the input terminals of a comparator circuit 38 (first detecting means) via an absolute value circuit 44, and also to one of the input terminals of a comparator circuit 40 via a differentiator circuit 39. To the other ones of the input terminals of the comparator circuits 38 and 40 are supplied reference voltages $V_b$ and $V_c$ from dc power supplies 41 and 42, respectively. Also, the outputs of the comparator circuits 38 and 40 are adapted to be supplied to the controlling circuit 37. The comparator circuit 38 is assigned to compare the level of the output of the absolute value circuit 44 with the level of the reference voltage $V_b$, and in case the level of the output of the absolute value circuit 44 is higher than the level of the reference voltage $V_b$, this comparator circuit 38 outputs an "0" signal of binary logic level, and in case it is lower than the reference voltage, it outputs a "1" signal of binary logic level. It should be understood here that the level of the reference voltage $V_b$ is set at a value slightly lower than the level of the output voltages $V_1$ of the dc power supplies 26 and 30. Also, the level of the reference voltage $V_c$ is set at a value substantially lower than that of said reference voltage $V_b$, or at zero. Typically, it is set at a value about $\frac{1}{3}$ of the level of the reference voltage $V_b$. The differentiator circuit 39 and the comparator cirucit 40 jointly constitute a means 43 (second detecting means) for detecting an input signal of quick build-up, i.e. high frequency input signal. In case the absolute value circuit 44 outputs a signal whose rise time is shorter than a predetermined rise time, the comparator circuit 40 outputs a signal of "0" level. Also, in case the absolute value circuit 44 outputs a signal having a rise time longer than the predetermined rise time, this comparator circuit 40 outputs a signal of "1" level. Said predetermined rise time or build-up time means a period of time determined by the reference voltage $V_c$ and by a time constant which is defined by the differentiator circuit 39. Also, the controlling circuit 37 is a circuit which will output a controlling signal S to render the switching circuits 27 and 31 conductive in case either one of the output signals of the comparator circuits 38 and 40 has become a "0" signal.

Next, description will hereunder be made of the operation of the power amplifier having the foregoing arrangement. Firstly, when there is applied to the input terminal 20 an input signal of a low frequency and of a relatively low level, i.e. when an input signal such that the peak value of an output signal corresponding to said input signal is lower than the level of the reference voltage $V_b$ is applied, the outputs of the comparator circuits 38 and 40 both will become a "1" signal, and accordingly no controlling signal S is outputted from the controlling circuit 37, so that both switching circuits 27 and 31 are rendered non-conductive. Thus, a voltage $+V_1$ and a voltage $-V_1$ of the dc power supplies 26 and 30 are supplied to the transistors 22 and 24, respectively.

In case there is applied to the input terminal 20 an input signal of a low frequency and of a relatively high level, i.e. a signal such that the peak value of an output signal corresponding to this input signal is higher than the level of the reference voltage $V_b$, the output of the comparator circuit 38 becomes a "0" signal at the point of time when the level of the output of the absolute value circuit 44 has exceeded the level of the reference voltage $V_b$. As a result, there is outputted a controlling signal S from the controlling circuit 37, so that the switching circuits 27 and 31 are both rendered conductive. Thus, a voltage $+V_2$ and a voltage $-V_2$ are supplied to the transistors 22 and 24, respectively. And, at the point of time when the level of the output of the absolute value circuit 44 has become lower than the level of the reference voltage $V_b$, the output of the comparator circuit 38 is switched back to the "1" level signal, and as a result no controlling signal S is allowed to be outputted. Accordingly, the switching circuits 27 and 31 are both switched back to their non-conductive state. During the foregoing operation, the output of the comparator circuit 40 holds the "1" level signal because the input signal has a low frequency.

Figure 3:
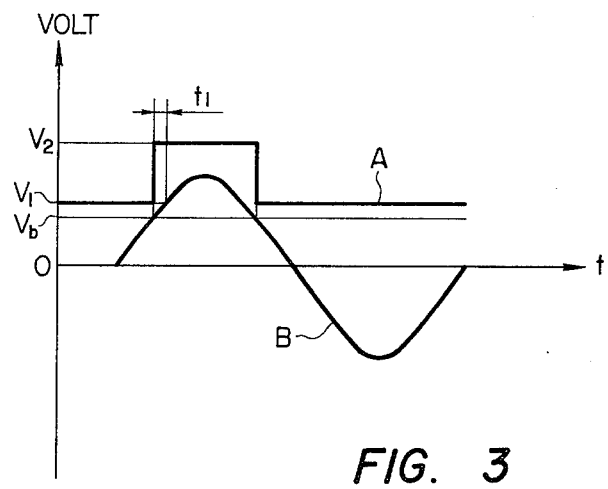
FIG. 3 is a chart for explaining the operation of the power amplifier shown in FIG. 2 in case an input signal is a low frequency signal.

In connection with the foregoing operation, the relationship between the output signal derived at the output terminal 35 and the collector potential of the transistor 22 is illustrated in FIG. 3. In this Figure, the square-pulse like line indicated at symbol A represents the collector potential of the transistor 22, and the curved line indicated at symbol B represents the output signal derived at the output terminal 35. As will be understood clearly from this Figure, it takes a length of time $t_1$ before the level of the output signal arrives at the level of the voltage $V_1$ afer gaining the level of the reference voltage $V_b$ even where the level of the reference voltage $V_b$ is set at a level slightly low in the vicinity of the voltage $V_1$. Accordingly, if the total of the switching time of the switching circuit 27 and the operation delay time of such circuits as the comparator circuit 38 and the controlling circuit 37 is smaller than the time $t_1$, no distortion will appear in the output signal. However, in case the output signal has a high frequency, i.e. in case the rise or build-up of the output signal is quick, the time $t_1$ will become smaller or shorter than the total of the switching time of the switching circuit 27 and the delay time in such circuits as the comparator circuit 38, so that the variation of the collector voltage of the transistor 22 will no longer become able to follow the output signal. Thus, the output signal will be distorted. It is the circuit, i.e. the build-up speed detecting means 43, that is inserted to prevent such undesirable condition to take place.

Next, description will be made of the instance wherein this detecting means 43 is operated.

Figure 4:
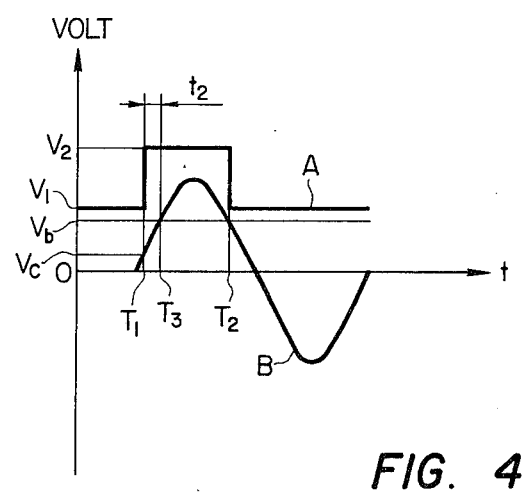
FIG. 4 is a chart for explaining the operation of the power amplifier shown in FIG. 2 in case an input signal is a high frequency signal.

In case there is applied to the input terminal 20 an input signal of a high frequency and of a relatively high level, it should be understood that, because of the output signal builds up quickly, the differentiator circuit 39 generates an output voltage of a certain level. In case the level of this output voltage is above the reference voltage $V_c$, the output of the comparator circuit 40 becomes a "0" signal, so that a controlling signal S is outputted from the controlling circuit 37. More specifically, in such instance, a controlling signal S is outputted at the timing $T_1$ shown in FIG. 4. It should be noted here that the period of time in which the output of said comparator circuit 40 becomes "0" signal is only a trifle length of time, but that the controlling signal S is adapted to be outputted successively for a certain period of time by the action of a holding circuit provided within the controlling circuit 37. If, during the period of time in which this controlling signal S is outputted successively, the level of the output signal indicated at symbol B in FIG. 4 reaches the reference voltage $V_b$, i.e. at time $T_3$ in FIG. 4, the output of the comparator circuit 38 becomes an "0" signal. As a result, the controlling signal S continues to be outputted successively. And, when the level of the output signal becomes lower than the reference voltage $V_b$, i.e. at timing $T_2$ in FIG. 4, the output of the controlling signal S is ceased. As a result, the collector potential of the transistor 22 will vary in such manner as shown by symbol A in FIG. 4. It should be noted here that the time scale on the horizontal axis in the chart of FIG. 4 is exaggerated than the time scale on the horizontal axis in FIG. 3.

In case the frequency of the input signal is high as in the instance mentioned above, a controlling signal S is outputted at build-up timing $T_1$ of the output waveshape. Accordingly, as compared with such instance wherein a controlling signal S is outputted by being based only on the level of the output signal, i.e. in case the input signal is of a low frequency as stated above, it is possible to output a controlling signal S earlier by the period of time $t_2$ shown in FIG. 4. As a result, even where there is a time delay in the switching time of the switching circuits 27 and 31 and in the controlling circuit 37 or like circuit, the variation of the collector potential of the transistor 22 is able to follow the variation of the output signal, so that it becomes possible to prevent the development of distortion. Not only that, but also it becomes possible to set the reference voltage $V_b$ at a value quite close to the voltage $V_1$, so that it is possible to enhance the power efficiency of this power amplifier.

Figure 5:
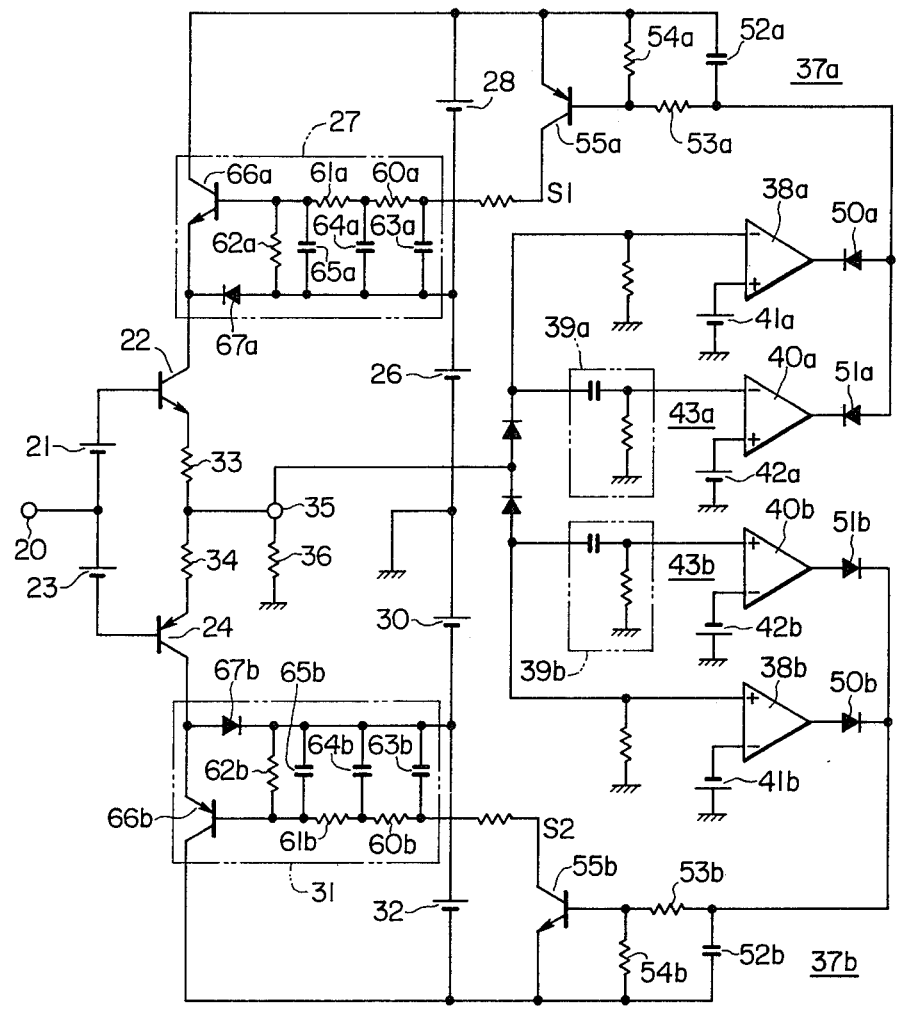
FIG. 5 is a circuit diagram showing a concrete embodiment of the power amplifier according to the present invention.
Figure 7:
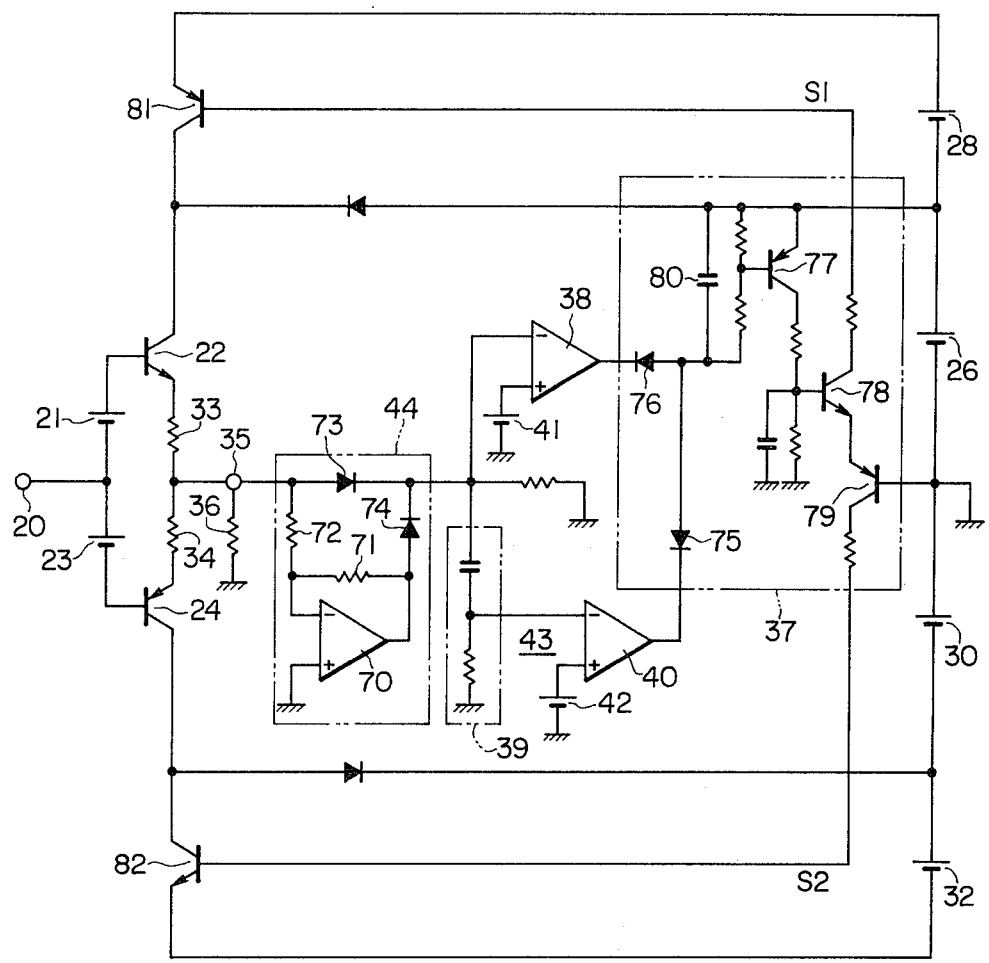
FIG. 7 is a circuit diagram showing another concrete example of the power amplifier according to the present invention.

Hereunder will be explained a couple of concrete embodiments of the present invention. FIGS. 5 and 7 are circuit diagrams showing concrete embodiments of the present invention. In these Figures, those parts corresponding to the respective regions of the circuitry shown in FIG. 2 are given like reference numerals and symbols.

Figure 6:
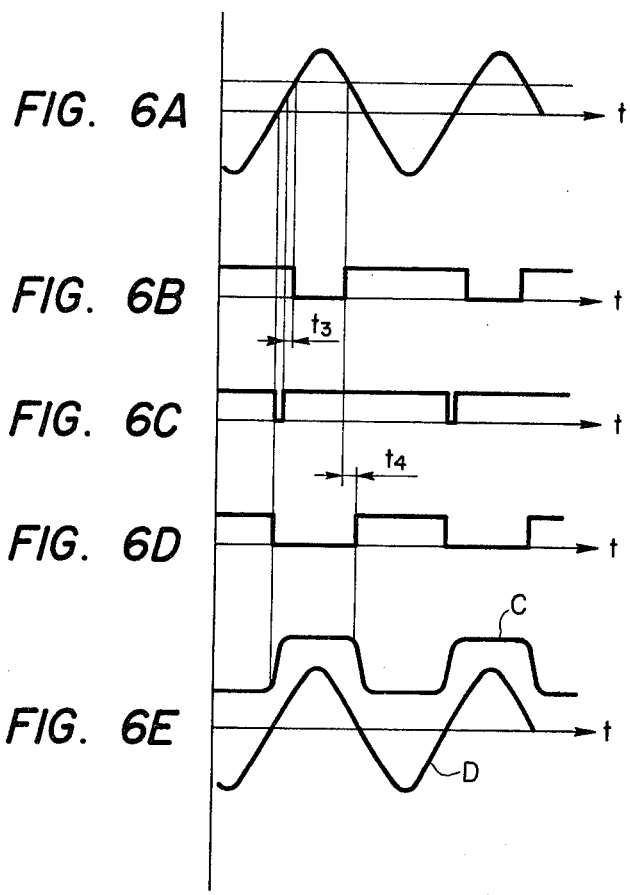
FIGS. 6A to 6E are timing charts for explaining the operation of the power amplifier shown in FIG. 5

The power amplifier shown in FIG. 5 is arranged so that, in place of the provision of the absolute value circuit 44 employed in the embodiment shown in FIG. 2 which gives the basic idea of the present invention, there are provided two systems each comprising a comparator circuit 38, a signal build-up speed detecting means 43 and a controlling circuit 37, so as to control the switching circuits 27 and 31 by these circuits in the two systems, respectively. In FIG. 5, the suffix "a" which is given to reference numerals is assigned to the respective parts of the positive side system which is intended to control the switching circuit 27, whereas the suffix "b" is assigned to the respective parts of the negative side system assigned to control the switching circuit 31. More particularly, in FIG. 5, the switching circuit 27 is controlled by a controlling signal $S_1$ which is an output signal of a controlling circuit 37a. On the other hand, the switching circuit 31 is controlled by a controlling signal $S_2$ which is an output signal of a controlling circuit 37b. The controlling circuit 37a is comprised of diodes 50a and 51a, a capacitor 52a, resistors 53a and 54a, and a transistor 55a. In this controlling circuit 37a, the diodes 50a and 51a serve as an OR circuit for deriving output signals of comparator circuits 38a and 40a, respectively. The output of this OR circuit is amplified by the transistor 55a, and supplied, as controlling signal $S_1$, to the switching circuit 27. Also, the capacitor 52a is intended to hold the controlling signal $S_1$ for a certain period of time. More particularly, in case an input signal of a high frequency is applied to the input terminal 20, and in case an output signal shown by FIG. 6A is derived at the output terminal 35, the output of the comparator circuit 38a will have such waveshape as shown in FIG. 6B. Also, the output of the comparator circuit 40a will have a waveshape as shown in FIG. 6C. Let us here assume that the circuit is not provided with the capacitor 52a. Then, the controlling signal $S_1$ will not be outputted for a period of time $t_3$ shown in FIG. 6B to cause a cut-off period. Since, however, the controlling signal $S_1$ is held for a certain period of time by the capacitor 52a, the controlling signal $S_1$ will have a waveshape as shown in FIG. 6D, so that such cut-off period is prevented from taking place. It should be noted here that in the chart of FIG. 6, the time $t_4$ also is one which is obtained from the holding action by the capacitor 52a.

The switching circuit 27 is comprised of resistors 60a–62a, capacitors 63a–65a, a transistor 66a, and a diode 67a. In this arrangement, the transistor 66a is a switching transistor. Also, the time constant circuit which is formed by the resistors 60a–62a and the capacitors 63a–65a is intended to prevent the development of switching noises of the transistor 66a. More particularly, in case a control signal $S_1$ shown in FIG. 6D is applied to the switching circuit 27, the collector potential of the transistor 22 will rise with a time constant which is determined by the resistors 60a and 61a and the capacitors 63a–65 a, and will decay with the time constant determined by the capacitors 63a–65 a and the resistor 62a. As a result, the collector potential of the transistor 22 will assume a waveshape having a smooth rise and fall pattern as shown by simbol C in FIG. 6E, so that the generation of switching noises in the transistor 66a can be prevented. The waveshape shown by symbol D in FIG. 6E is identical with the waveshape of the output signal shown in FIG. 6A. Also, the arrangement and the operation of the controlling circuit 37b and the switching circuit 31 are similar to those of the abovesaid controlling circuit 37a and the switching circuit 27. Therefore, their explanation is omitted.

As stated above, the provision of the build-up speed detecting means 43a and 43b permits the performance that, in case an output or input signal is one which rises quickly, the power supply can be switched over to one having a high voltage level at a point of time sufficiently before said signal gains a certain level $V_b$. Accordingly, the switching-over of connection to power supply can be made just in time before generation of switching noises even when this switching is done relatively slowly with a certain time constant. It sould be noted here that the comparator circuits 38a, 38b and 40a,40b deal with a very small current, so that they are free of noise generation. Whereas, the transistors 66a and 66b deal with a large current, and hence the switching noises become a problem.

As stated above, the power amplifier shown in FIG. 5 is such that the switching circuits 27 and 31 are arranged so that the collector potentials of the transistors 22 and 24 will vary smoothly, to prevent the generation of switching noises in the transistors 66a and 66b. The reason that the amplifier can be arranged as stated above is because that the amplifier includes the above-said detecting means 43a and 43b, whereby controlling signals $S_1$ and $S_2$ can be outputted at a point of time earlier than the timing in the instance of detection of merely a signal level alone, and because thereby a sufficient margin of time is allowed for the timing of switching between the power supplies.

Description will next be made of another concrete embodiment shown in FIG. 7. The power amplifier illustrated is arranged so that both the positive and negative power supplies can be switched over simultaneously by the use of an absolute value circuit 44. This absolute circuit 44 is a known full-wave rectifying circuit comprised of a phase-inverting amplifier 70, resistors 71 and 72 and diodes 73 and 74. Also, the controlling circuit 37 is arranged by members such as diodes 75 and 76, transistors 77–79 and a capacitor 80. In this circuitry, the diodes 75 and 76 form an OR circuit. The output of this OR circuit is amplified by the transistors 77–79, and then applied, as controlling signals $S_1$ and $S_2$, to the respective bases of switching transistors 81 and 82, so that these transistors 81 and 82 can be controlled simultaneously by an output signal regardless of whether this is a positive or a negative signal. The capacitor 80 is intended to hold the controlling signals $S_1$ and $S_2$ for a certain period of time in much the same way as by the capacitors 52a and 52b in FIG. 5.

In the power amplifier circuitries shown in FIGS. 2, 5 and 7, the detection of the level and the rise time input or output signal are carried out invariably by an output signal derived at the output terminal 35. Such detection may be performed, with similar effects, by an input signal derived at the input terminal 20.

What is claimed is:

1. An amplifier with power supply switching, comprising:
    amplifying means for amplifying an input signal to said amplifier;
    power supply means selectively supplying high and low voltages to said amplifying means;
    first detecting means for detecting a level of a signal corresponding to said input signal and generating a first detection signal when said level is in a certain relationship with a first reference signal;
    second detecting means for detecting a rise time of said signal corresponding to said input signal and generating a second detection signal when said rise time is in a certain relationship with a second reference signal; and
    switching circuit means being responsive to either of said first and second detection signals for switching levels of the voltages supplied from said power supply means to said amplifying means in accordance with said first and said second detection signals.

2. An amplifier according to claim 1, said first detecting means comprises:
    a first reference voltage generator generating the first reference signal which is a voltage of a first reference level; and
    a comparator receptive of said signal corresponding to said input signal to compare its level with said first reference level.

3. An amplifier according to claim 2, in which said first reference level is set at a level slightly lower than a level of voltage corresponding to the low voltage supplied from said power supply means.

4. An amplifier according to claim 1, in which said second detecting means comprises:
    a differentiator receptive of said signal corresponding to said input signal to generate a differentiation signal of a level corresponding to a rise time of said signal corresponding to said input signal;
    a second reference voltage generator generating the second reference signal which is a voltage of a second reference level; and
    a comparator receptive of said differentiation signal to compare its level with said second reference level.

5. An amplifier according to claim 4, in which said second reference level is set substantially lower than said first reference level.

6. An amplifier according to claim 1, in which said switching means comprises a switching element for switching, by its on-off actions, the voltages supplied to said amplifying means between high and low levels.

7. An amplifier according to claim 6, in which said switching circuit means further comprises: a first and a second time constant circuit provided on control input side of said switching element, to make a smooth "on" action of said switching element by said first time constant circuit and to make a smooth "off" action of said switching element by said second time constant circuit.

8. An amplifier according to claim 1, in which said amplifier further comprises controlling circuit means receptive of at least said second detection signal to hold the second signal for a certain period of time to supply said second detection signal to said switching circuit means.

9. An amplifier according to claim 8, in which said controlling circuit means comprises:
    OR circuit means receptive of said first and second detection signals;
    holding circuit means receptive of an output signal from said OR circuit means to hold the received signal for a certain period of time; and
    an amplifying element for amplifying a signal delivered from said holding circuit means before delivering same to said switching circuit means.

10. An amplifier according to claim 1, in which:
    said amplifier is comprised of an SEPP circuit using balanced power supply means comprising a positive power supply and a negative power supply, and
    said switching circuit means is provided one for each of the positive and negative power supplies to be operated separately from each other to effect switching between voltage levels of the positive power supply separately from effecting switching between voltage levels of the negative power supply.

11. An amplifier according to claim 10, in which said first and second detecting means forming two pairs, and one said pair is provided to detect a positive side of said signal corresponding to said input signal and another said pair is provided to detect a negative side of the same signal.

12. An amplifier according to claim 1, in which:
said amplifier is comprised of an SEPP circuit using balanced power supply means comprising a positive power supply and a negative power supply, and
said switching circuit means is provided one for each of the positive and negative power supplies to be operated concurrently to simultaneously effect switching between voltage levels of the positive and negative power supplies.

13. An amplifier according to claim 12, further comprising absolute value circuit means for detecting an absolute value of said signal corresponding to said input signal and for delivering an output to said first and second detecting means, an output of said first and second detecting means being coupled in common to the switching circuit means of each of the positive and negative power supplies of said balanced power supply means.

14. An amplifier according to claim 13, in which said absolute value circuit means is comprised of a full-wave rectifying circuit.

15. An amplifier according to claim 1, in which said signal corresponding to said input signal is an output signal from said amplifying means.

* * * * *